(12) United States Patent
Wang et al.

(10) Patent No.: US 12,375,039 B2
(45) Date of Patent: Jul. 29, 2025

(54) CRYSTAL OSCILLATOR BASED ON DUTY RATIO MEASUREMENT

(71) Applicants: Nanjing University Of Posts And Telecommunications, Suzhou (CN); NANTONG INSTITUTE OF NANJING UNIVERSITY OF POSTS AND TELECOMMUNICATIONS CO., LTD., Suzhou (CN)

(72) Inventors: Zixuan Wang, Suzhou (CN); Xin Wang, Suzhou (CN); Zhikuang Cai, Suzhou (CN); Yufeng Guo, Suzhou (CN); Jiafei Yao, Suzhou (CN)

(73) Assignees: Nanjing University Of Posts And Telecommunications, Jiangsu (CN); NANTONG INSTITUTE OF NANJING UNIVERSITY OF POSTS AND TELECOMMUNICATIONS CO., LTD., Jiangsu (CN)

( * ) Notice: Subject to any disclaimer, the term of this patent is extended or adjusted under 35 U.S.C. 154(b) by 0 days.

(21) Appl. No.: 18/851,063

(22) PCT Filed: May 11, 2023

(86) PCT No.: PCT/CN2023/093463
§ 371 (c)(1),
(2) Date: Sep. 26, 2024

(87) PCT Pub. No.: WO2024/159647
PCT Pub. Date: Aug. 8, 2024

(65) Prior Publication Data
US 2025/0219578 A1     Jul. 3, 2025

(30) Foreign Application Priority Data

Jan. 31, 2023   (CN) .......................... 202310046966.8

(51) Int. Cl.
*H03B 5/04*    (2006.01)
*H03B 5/32*    (2006.01)

(52) U.S. Cl.
CPC ................. *H03B 5/04* (2013.01); *H03B 5/32* (2013.01); *H03B 2200/0094* (2013.01)

(58) Field of Classification Search
CPC ...................................................... H03B 5/04
(Continued)

(56) References Cited

U.S. PATENT DOCUMENTS

| 2018/0115410 | A1  | 4/2018 | Tajalli et al. |
| 2020/0099337 | A1* | 3/2020 | Powell ...................... H03L 7/08 |
| 2022/0239255 | A1* | 7/2022 | Pamarti ..................... H03L 3/00 |

FOREIGN PATENT DOCUMENTS

| CN | 111510134 | 8/2020 |
| CN | 114244354 | 3/2022 |

(Continued)

OTHER PUBLICATIONS

"International Search Report (Form PCT/ISA/210) of PCT/CN2023/093463," mailed on Jun. 23, 2023, with English translation thereof, pp. 1-4.

(Continued)

*Primary Examiner* — Joseph Chang
(74) *Attorney, Agent, or Firm* — JC ONE WORLD (57) ABSTRACT

Disclosed in the present invention is a crystal oscillator based on duty ratio measurement, comprising a first inverter, a resistor, a first load capacitor, a second load capacitor, first to fourth switches, a quartz crystal, a buffer, a sampling and holding module, a first comparator, a second comparator, a phase conversion module, a digital control module, and an energy injection module. One end of the quartz crystal is used for signal injection, a signal at the other end of the quartz crystal is sampled and processed, information repre- (Continued)

senting phase error accumulation, i.e., a signal of which the duty ratio is continuously changing, is obtained by means of the first comparator, and finally the duty ratio is measured by means of the phase conversion module and the second comparator, so as to obtain an accurate moment of phase switching.

9 Claims, 7 Drawing Sheets

(58) Field of Classification Search
USPC .......................................................... 331/158
See application file for complete search history.

(56) References Cited

FOREIGN PATENT DOCUMENTS

| | | |
|---|---|---|
| CN | 115208320 | 10/2022 |
| CN | 115498998 | 12/2022 |
| CN | 115800927 | 3/2023 |

OTHER PUBLICATIONS

"Written Opinion of the International Searching Authority (Form PCT/ISA/237) of PCT/ CN2023/093463," mailed on Jun. 23, 2023, pp. 1-4.

* cited by examiner

CRYSTAL OSCILLATOR BASED ON DUTY RATIO MEASUREMENT

CROSS-REFERENCE TO RELATED APPLICATION

This application is a 371 of international application of PCT application serial no. PCT/CN2023/093463, filed on May 11, 2023, which claims the priority benefit of China application no. 202310046966.8, filed on Jan. 31, 2023. The entirety of each of the above mentioned patent applications is hereby incorporated by reference herein and made a part of this specification.

TECHNICAL FIELD

The present disclosure belongs to the technical field of the integrated circuits.

RELATED ART

For Internet of Things (IOT) systems, the requirements for the low power consumption are crucial to extend the battery life of various handheld and wearable devices. In IOT systems, the crystal oscillator that provides a stable reference clock for the modules such as the phase-locked loops and the analog-to-digital converters has an extremely slow startup process (2 ms to 5 ms) due to the high-quality factor, which has a significant impact on the power consumption of the system. Therefore, the startup time of the reference clock is a bottleneck that limits the further reduction of low-power IOT systems, so it is necessary to design a rapid startup crystal oscillator.

At present, the existing research solutions for shortening the startup time of the crystal oscillator can be divided two categories. One is to increase the negative resistance of the crystal oscillator, and the other is to inject the same frequency signal at both terminals of the crystal. The first solution mainly includes two methods, one is to increase the negative resistance of the crystal oscillator by increasing the transconductance of the amplifier, and the other is to increase the equivalent negative resistance of the crystal oscillator by the dynamic load regulation. However, the parallel capacitance inside the crystal limits the increasing of the negative resistance, and the shortened startup time is extremely limited.

The second solution requires that the frequency error between the injection signal and the crystal oscillator must be as little as possible, so that the phase error is accumulated slowly, and the energy injection can be implemented effectively. Otherwise, when the phase is accumulated to a certain extent, the injection will have a negative effect. The methods that have been proposed include the scanning frequency injection and the dithering frequency injection. Although the startup time is reduced, a lot of energy is wasted, and the energy cannot be injected continuously. The synchronous injection and the two-step injection have also been proposed by some people, which further reduce the startup time, whereas the injection switching is blind, and the requirements for the frequency error between the injection signal and the crystal oscillator is still extremely high.

SUMMARY OF INVENTION

The objectives of the present disclosure are as follows. In order to solve the problems existing in the above-mentioned prior art, a crystal oscillator based on a duty-cycle detection is provided in the present disclosure.

Technical solutions are as follows. A crystal oscillator based on a duty-cycle detection is provided in the present disclosure. The crystal oscillator comprises a first inverter, a resistor, a first capacitor and a second load capacitor, a first switch, a second switch, a third switch, a fourth switch, a quartz crystal, a buffer, a sampling and holding module, a first comparator, a second comparator, a phase conversion module, a digital control module and an energy injection module. One terminal of the quartz crystal is recorded as XI, and another terminal of the quartz crystal is recorded as XO; the digital control module is configured to generate switch control signals $EN_{INJ}$ and $\overline{EN_{INJ}}$ according to an external control signal, the $EN_{INJ}$ is used for controlling the third and the fourth switches to be opened and closed, the $\overline{EN_{INJ}}$ is used for controlling the first and the second switch to be opened and closed, the $\overline{EN_{INJ}}$ is an inverted signal of $EN_{INJ}$, the energy injection module includes a ring-shaped oscillator and a delay locked loop, the ring-shaped oscillator is configured to generate a square wave signal $RO_{OUT}$, the delay locked loop is configured to divide the square wave signal $RO_{OUT}$ into N-path signals with a same frequency and different phases, and the N-path signals are recorded as $DLL_{OUT}$, where N≥4.

In an energy injection mode of the crystal oscillator, the third and fourth switches are both closed; the quartz crystal is configured to generate an oscillation signal $F_{XO}$, and the XO terminal of the quartz crystal is configured to transmit a superimposed signal to the buffer through the fourth switch, and the superimposed signal is a signal after superimposing the signal $F_{XO}$ with an injection signal INJ injected into the quartz crystal; the buffer is configured to isolate the sampling and holding module and the XO terminal of the quartz crystal, the buffer is configured to output a signal $XO_{TEST}$ to the sampling and holding module and an non-inverting input terminal of the first comparator, the sampling and holding module is configured to collect a high level of the first cycle of the signal $XO_{TEST}$ to obtain a signal $V_S$, and output the signal $V_S$ to an inverting input terminal of the first comparator; the first comparator is configured to convert phase error accumulation information between the $XO_{TEST}$ and the $V_S$ into a signal PW, and transmit the signal PW to the phase conversion module, the phase conversion module is configured to convert a TSET signal output by the digital control module into an analog voltage $V_{REF}$ and transmit the analog voltage quantity $V_{REF}$ to an inverting input terminal of the second comparator, the phase conversion module is configured to convert the signal PW into an analog voltage quantity $V_{PW}$, and transmit the analog voltage $V_{PW}$ to the non-inverting input terminal of the second comparator, the TSET signal is generated by the digital control module according to the $DLL_{OUT}$ signal; the second comparator is configured to compare the $V_{PW}$ and the $V_{REF}$ to generate an enable signal $EN_{SWITCH}$ and input the enable signal $EN_{SWITCH}$ into the digital control module, the digital control module is configured to generate an EN signal according to the enable signal $EN_{SWITCH}$, and input the EN signal to the energy injection module, the EN signal is N-bit signals; the energy injection module is configured to transmit the $DLL_{OUT}$ signal to the digital control module, and select one bit signal from the $DLL_{OUT}$ signal as the injection signal INJ according to the EN signal and transmit the injection signal INJ to the XI terminal of the quartz crystal through the third switch.

In a stable oscillation mode of the crystal oscillator, the first and second switches are both closed, one terminal of the first switch is in connection with the XI terminal of the quartz crystal, and another terminal of the first switch is in connection with one terminal of the resistor, one terminal of the first load capacitor and an input terminal of the first inverter; one terminal of the second switch is in connection with the XO terminal of the quartz crystal, another terminal of the second switch is in connection with another terminal of the resistor, one terminal of the second load capacitor and an output terminal of the second inverter, and another ends of the first load capacitor and the second load capacitor are both grounded.

Further, the sampling and holding module includes a fifth switch and a sampling capacitor, one terminal of the fifth switch is in connection with the buffer, and another terminal of the fifth switch is in connection with the inverting input terminal of the first comparator and one terminal of the sampling capacitor, and another terminal of the sampling capacitor is grounded, the fifth switch is controlled by an enable signal ENSH generated by the digital control module.

Further, when a first rising edge of the injection signal INJ is detected by the digital control module, the enable signal $EN_{SH}=1$, and the fifth switch is closed; when a first falling edge of the injection signal INJ is detected by the digital control module, the enable signal $EN_{SH}=0$, and the fifth switch is opened.

Further, the phase conversion module includes an analog voltage quantity VPW conversion circuit and an analog voltage quantity $V_{REF}$ conversion circuit; the analog voltage quantity $V_{PW}$ conversion circuit includes a sixth switch and a seventh switch, a second inverter, a single-pole double-throw switch, a first charging capacitor and an XOR gate; one input terminal of the XOR gate is in connection with the injection signal INJ, another input terminal of the XOR gate is in connection with the signal PW and a second fixed terminal of the single-pole double-throw switch, an output terminal of the XOR gate is in connection with a fixed terminal of the single-pole double-throw switch, a moving terminal of the single-pole double-throw switch is configured to output an enabling signal for controlling the seventh switch to be opened and closed, the moving terminal of the single-pole double-throw switch is further in connection with the input terminal of the second inverter; the output terminal of the second inverter is configured to output an enable signal for controlling the sixth switch to be opened and closed; one terminal of the sixth switch and one terminal of the first charging capacitor are grounded; another terminal of the sixth switch is served as an output terminal for the analog voltage quantity $V_{PW}$ conversion circuit, and is in connection with another terminal of the first charging capacitor and one terminal of the seventh switch; another terminal of the seventh switch is in connection with the voltage VDD.

The analog voltage quantity VREF conversion circuit includes a second charging capacitor and an eighth switch, and the TEST signal is used for controlling the eight switch to be opened and closed, one terminal of the eighth switch is served as an output terminal of the analog voltage quantity VREF conversion circuit and is in connection with one terminal of the second charging capacitor; another terminal of the second charging capacitor is grounded; another terminal of the eighth switch is in connection with the voltage VDD.

Further, the TSET signal is generated by the digital control module according to the signal $DLL_{OUT}$, specifically. the digital control module is configured to extract the injection signal INJ and a next bit signal adjacent to INJ from the signal $DLL_{OUT}$, when the rising edge of INJ is detected by the digital control module, then TEST=1, and when the rising edge of the next bit signal adjacent to INJ detected by the digital control module, then TEST=0.

Further, the second comparator is configured to compare the $V_{PW}$ and the $V_{REF}$ to generate the enable signal $EN_{SWITCH}$, specifically, when $V_{PW} \leq V_{REF}$, then $EN_{SWITCH}=0$, when VPW>VREF, then $EN_{SWITCH}=1$.

Further, the digital control module is configured to generate the EN signal according to the enable signal $EN_{SWITCH}$, specifically, an initial signal EN is set, and an i-th bit signal in the initial signal is 1, where i=1, 2, ..., N; when the frequency of the injection signal INJ is greater than the frequency of the $F_{XO}$ signal, and $EN_{SWITCH}=1$, then a (i−1)-th bit signal in the EN signal is set to 1, and the i-th bit signal is set to 0; when the frequency of the injection signal INJ is equal and less than the frequency of the $F_{XO}$ signal, and $EN_{SWITCH}=1$, then the i-th bit signal in the EN signal is set to 0, and the (i+1)-th bit signal is set to 1.

Further, the energy injection module further includes a multiplexer, the delay locked loop is configured to transmit the generated $DLL_{OUT}$ signal to the multiplexer, and the multiplexer is configured to select one bit signal from the $DLL_{OUT}$ signal as the injection signal INJ according to the input signal EN.

Further, the energy injection module is configured to select one bit signal in the $DLL_{OUT}$ signal as the injection signal INJ according to the EN signal, specifically, when the i-th bit signal in the EN signal is 1, the (N−i+1)-th bit signal in the $DLL_{OUT}$ signal is selected as the injection signal, where i=1, 2, ..., N.

Beneficial Effects (1) The crystal oscillator based on the duty-cycle detection is provided in the present disclosure. One terminal of the crystal oscillator is configured to inject, the other terminal of the crystal oscillator is configured to acquire the phase error accumulation information, which accurately switches the phase while injecting signals, solves the problem that the energy injection solution cannot be continuously injected due to the phase error accumulation, and detects the duty cycle in real time, thereby avoiding the blindness of the phase switching.

(2) The circuit structures of the present disclosure are simple. The phase is switched accurately through the duty-cycle detection technology on the basis of implementing the low power consumption, which ensures the continuous energy injection without being limited by the phase accumulation.

(3) The present disclosure has a large tolerance for the frequency error between the injected signal and the crystal oscillator, which reduces the requirements for the design and the calibration of the on-chip integrated oscillator.

DESCRIPTION OF EMBODIMENTS

The accompanying drawings constituting one part of the present disclosure are used to provide a further understanding of the present disclosure, and the exemplary embodiments of the present disclosure and the descriptions are used to illustrate the present disclosure, and do not constitute the improper limitations on the present disclosure.

Figure 1:
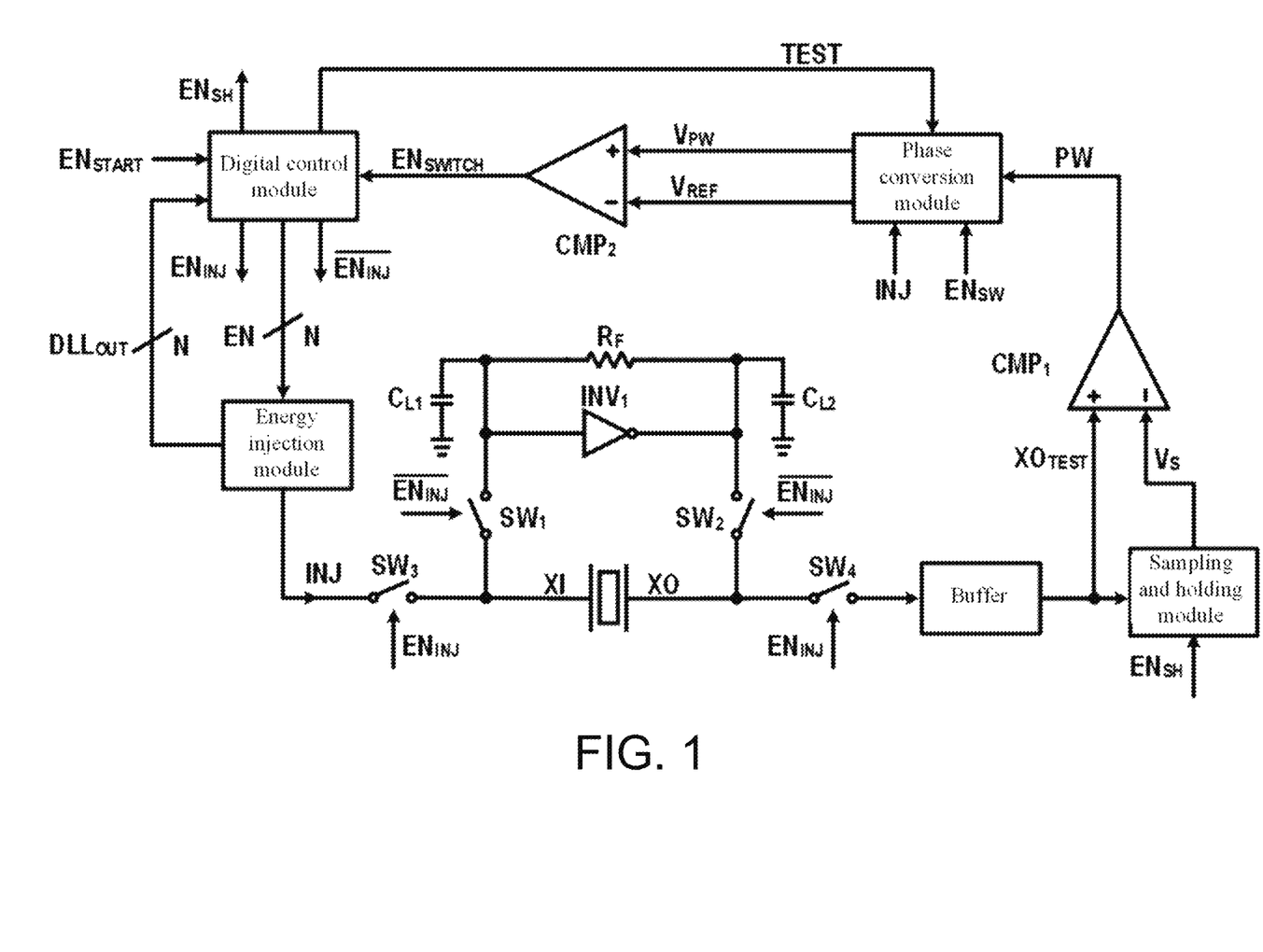
FIG. 1 illustrates an overall circuit diagram of the present disclosure.

As illustrated in FIG. 1, a crystal oscillator based on a duty-cycle detection disclosed in the present disclosure includes a quartz crystal, a first inverter $INV_1$, a resistor $R_F$, a first load capacitor $CL_1$, a second load capacitor $CL_2$, a first switch $SW_1$, a second switch $SW_2$, a third switch $SW_3$, a fourth switch $SW_4$, a buffer, a sampling and holding module, a phase conversion module, a first comparator $CMP_1$, a second comparator CMP2, a digital control module and an energy injection module.

The enable signals generated by the digital control module include an $EN_{INJ}$ signal, a $\overline{EN_{INJ}}$ signal, an $EN_{SH}$ signal and a TEST signal.

When the $EN_{INJ}$ is enabled, the crystal oscillator is in an energy injection mode. In this embodiment, when $EN_{INJ}=1$, $EN_{INJ}$ is enabled, and the crystal oscillator is in the energy injection mode. When the $\overline{EN_{INJ}}$ is enabled, the crystal oscillator is in a stable oscillation mode. In this embodiment, when $\overline{EN_{INJ}}=1$, the crystal oscillator is in the stable oscillation mode.

When the $EN_{SH}$ is enabled, the sampling and holding module is started to sample and is completed sampling at a first falling edge of the injection signal INJ.

TEST is a set reference duty-cycle signal, which is converted into a corresponding analog voltage $V_{REF}$ by the phase conversion module to provide a phase switching threshold.

In the energy injection mode: the digital control module is configure to output an enable signal of $EN_{INJ}=1$ to control the third switch $SW_3$ and the fourth switch $SW_4$ to be closed. The quartz crystal is configured to generate a stable oscillation signal $F_{XO}$, and one terminal of the quartz crystal is recorded as XI, and the other terminal of the quartz crystal is recorded as XO. The XO terminal of the quartz crystal is configured to transmit a superimposed signal to the buffer through the fourth switch, and the superimposed signal is a signal after superposing the signal $F_{XO}$ and the injection signal INJ injecting into the quartz crystal. The buffer is configured to isolate the sampling and holding module and the XO terminal of the quartz crystal to avoid the interference of the sampling and holding module on the XO terminal of the quartz crystal. The buffer is configured to transmit the output signal $XO_{TEST}$ to the sampling and holding module and an non-inverting input terminal of the first comparator $CMP_1$. The sampling and holding module is configured to sample a high level of the first cycle of the signal $XO_{TEST}$ (the sampling is controlled by the enable signal $EN_{SH}$) to obtain a signal $V_S$ and output the signal $V_S$ to the inverting input terminal of the first comparator. The first comparator CMP1 is configured to compare the signal $XO_{TEST}$ and the signal $V_S$, and convert the phase error accumulation information into a signal PW, and the duty cycle of the signal PW is varied continuously. The first comparator is configure to transmit the signal PW to the phase conversion module, and the phase conversion module is configured to convert the signal PW and the signal TEST into the corresponding analog voltage quantities $V_{PW}$ and $V_{REF}$ respectively. The $V_{PW}$ output by the phase conversion module is in connection with the non-inverting input terminal of the second comparator $CMP_2$, and the $V_{REF}$ Output by the phase conversion module is in connection with the inverting input terminal of the second comparator $CMP_2$. The duty cycle is detected by the second comparator $CMP_2$ through comparing the $V_{PW}$ and $V_{REF}$ to generate the enable signal $EN_{SWITCH}$, which is specially as follows. When $V_{PW}$ is greater than $V_{REF}$, the enable $EN_{SWITCH}$ is jumped to 1, otherwise the $EN_{SWITCH}$ is 0. The $EN_{SWITCH}$ is in connection with the digital control module. The digital control module is configured to generate the EN signal according to the enable signal $EN_{SWITCH}$, and input the EN signal to the energy injection module, the EN signal is N-bit signals, The energy injection module is capable of generating N-path signals with a same frequency and different phases, which is recorded as $DLL_{OUT}$. The energy injection module is configured to transmit the $DLL_{OUT}$ signal to the digital control module, and select one bit signal as the injection signal INJ from the $DLL_{OUT}$ signal according to the EN signal, and the injection signal INJ is transmitted to the XI terminal of the quartz crystal through the third switch.

In the Stable oscillation mode: the digital control module is configured to output an enable signal $\overline{EN_{INJ}}$ to control the first switch $SW_1$ and the second switch $SW_2$ to be closed. One terminal of the first switch $SW_1$ is in connection with the XI terminal of the quartz crystal, the other terminal of the first switch $SW_1$ is in connection with one terminal of the load capacitor $CL_1$, the input terminal of the first inverter $INV_1$ and one terminal of the resistor $R_F$. The other terminal of the load capacitor $CL_1$ is grounded. One terminal of the second switch $SW_2$ is in connection with the XO terminal of the quartz crystal, and the other terminal of the second switch $SW_2$ is in connection with one terminal of the load capacitor $CL_2$, the output terminal of the first inverter $INV_1$ and the other terminal of the resistor $R_F$, and the other terminal of the load capacitor $CL_2$ is grounded.

A stable oscillation circuit is formed by the first inverter $INV_1$ and the resistor $R_F$, is configure to maintain the oscillation of the quartz crystal. The load capacitors $CL_1$ and $CL_2$ are configured to correct the oscillation frequency of the quartz crystal and improve the frequency stability.

The EN signal is generated by the digital control module according to the enable signal $EN_{SWITCH}$, which is specifically as follows. The initial signal of EN is set, and the i-th bit signal in the initial signal is 1, where i=1, 2, . . . , N. When the frequency of the injection signal INJ is greater than the frequency of the $F_{XO}$ signal, and $EN_{SWITCH}=1$, then the (i−1)-th bit signal in the EN signal is set to 1, and the i-th bit signal is set to 0. When the frequency of the injection signal INJ is equal or less than the frequency of the $F_{XO}$ signal, and $EN_{SWITCH}=1$, then the i-th bit signal in the EN signal is set to 0, and the (i+1)-th bit signal is set to 1. In this embodiment, when N=4, the initial signal of EN is 0001, when the frequency of the injection signal INJ is greater than the frequency of the $F_{XO}$ signal, and when $EN_{SWITCH}=1$, then EN=0010, and when the frequency of the injection signal INJ is equal or less than the frequency of the $F_{XO}$ signal, and when $EN_{SWTTH}=1$, then EN=1000.

Figure 2:
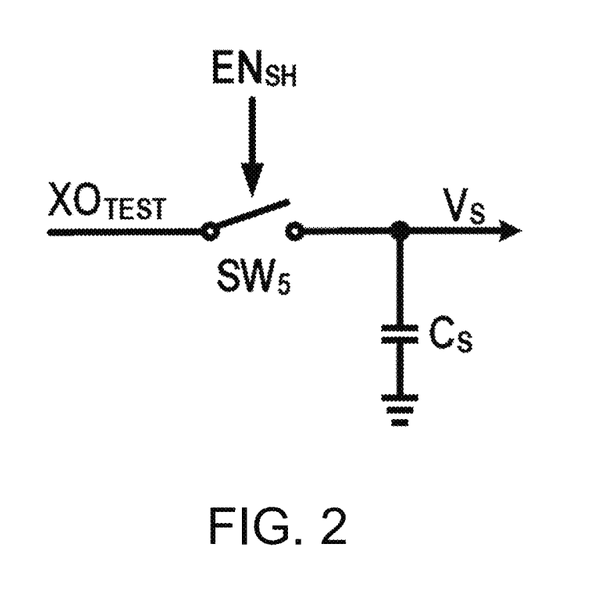
FIG. 2 illustrates a schematic diagram of a circuit structure of a sampling and holding module of the present disclosure.

A circuit diagram of a sampling and holding module of the present disclosure is as illustrated in FIG. 2. The sampling and holding module includes a fifth switch $SW_5$, a sampling capacitor CS. One terminal of the fifth switch $SW_5$ is in connection with the signal $XO_{TEST}$, the other terminal of the fifth switch $SW_5$ is in connection with one terminal of the sampling capacitor Cs and the signal $V_S$, and the other terminal of the sampling capacitor Cs is grounded. The enable signal $EN_{SH}$ is output by the digital control module to control the fifth switch $SW_5$.

When $EN_{INJ}=1$ and the first rising edge of the injection signal INJ is detected by the digital control module, the signal $EN_{SH}=1$, and the fifth switch is closed. When $EN_{INJ}=1$ and the first falling edge of the injection signal INJ is detected by the digital control module, the signal $EN_{SH}=0$, and the fifth switch is opened.

Figure 3:
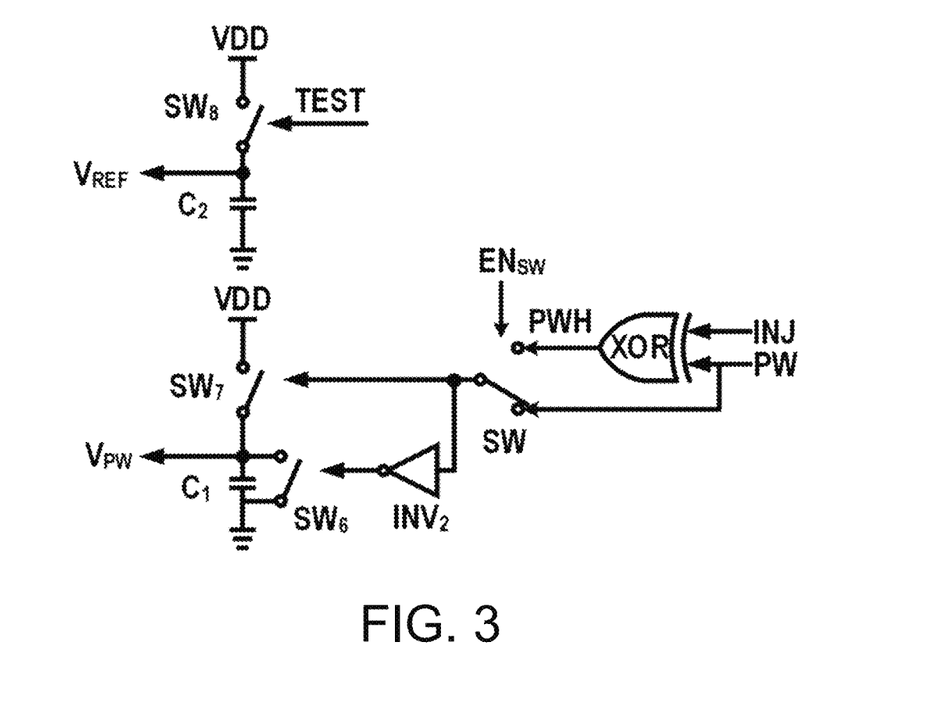
FIG. 3 illustrates a schematic diagram of a circuit structure of a phase conversion module of the present disclosure.

A circuit diagram of a phase conversion module of the present disclosure is as illustrated in FIG. 3. The phase conversion module includes a sixth switch $SW_6$, a seventh switch $SW_7$, an eighth switch $SW_8$, a first charging capacitor C1, a second charging capacitor C2, a second inverter $INV_2$, an Exclusive-OR gate (XOR), and a single-pole double-throw switch SW. When the frequency $F_{INJ}$ of the injection signal INJ is greater than the frequency of the oscillation signal $F_{XO}$, the duty cycle of the PW signal is gradually increased. When the $F_{INJ}$ is less than the frequency of the oscillation signal $F_{XO}$, the duty cycle of the PW signal is gradually decreased. Therefore, the duty cycle of the PW signal is still gradually increased through the XOR gate, when the $F_{INJ}$ is less than the frequency of the oscillation signal $F_{XO}$.

As illustrated in FIG. 3, the signal INJ and the signal PW are the inputs of the XOR gate, and the output signal PWH of the XOR gate is in connection with the first moving terminal of the single-pole double-throw switch SW. The single-pole double-throw switch SW is controlled by an external signal $EN_{SW}$ ($EN_{SW}$ is preset manually). The second moving terminal of the single-pole double-throw switch SW is in connection with the signal PW. The fixed terminal of the single-pole double-throw switch SW is in connection with the input terminal of the second inverter $INV_2$, and controls the seventh switch $SW_7$, and a signal output by the second inverter $INV_2$ is used for controlling the sixth switch $SW_6$. One terminal of the sixth switch $SW_6$ is served as the output terminal of the $V_{PW}$ signal of the phase conversion module, and is in connection with one terminal of the first charging capacitor C1 and one terminal of the seventh switch $SW_7$, and the other terminal of the $SW_6$ and the other terminal of the first charging capacitor C1 are both grounded. The other terminal of the seventh switch $SW_7$ is in connection with the VDD. One terminal of the eighth switch $SW_8$ is served as output terminal of the $V_{RE}$ signal of the phase conversion module, and is in connection with one terminal of the second charging capacitor $C_2$, and the other terminal of $SW_8$ is in connection with the VDD, and the other terminal of the second charging capacitor $C_2$ is grounded. The digital control module is configured to output the enable signal TEST for controlling the eighth switch $SW_8$.

Figure 4:
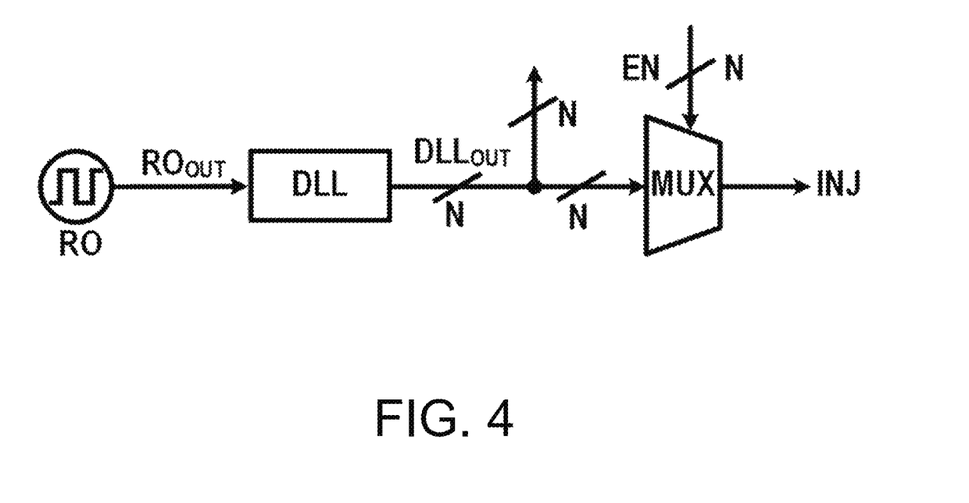
FIG. 4 illustrates a schematic diagram of a circuit structure of an energy injection module of the present disclosure.

A circuit diagram of an energy injection module is as illustrated in FIG. 4. The energy injection module includes a ring-shaped oscillator RO, a delay locked loop DLL and a multiplexer MUX. The ring-shaped oscillator is configured to generate a square wave signal $RO_{OUT}$, the delay locked loop is configured to divide the signal $RO_{OUT}$ into N-path signals with a same frequency and different phases, and the N-path signals are recorded as $DLL_{OUT}$. The delay locked loop is configured to transmit the generated $DLL_{OUT}$ signal to the multiplexer, and the multiplexer is configured to select one bit signal from the $DLL_{OUT}$ signal as the injection signal INJ according to the input signal EN.

The enable signal TSET is generated by the digital control module according to the signal $DLL_{OUT}$, which is specifically as follow. The digital control module is configured to extract the injection signal INJ and the next bit signal adjacent to INJ from the signal $DLL_{OUT}$, when the rising edge of INJ is detected by the digital control module, then TEST=1, and when the rising edge of the next signal adjacent to INJ is detected by the digital control module, then TEST=0.

The energy injection module is configured to select one bit signal from the $DLL_{OUT}$ signal as the injection signal INJ according to the EN signal, which is specifically as follow. When the i-th bit signal in the EN signal is 1, then the (N−i+1)-th bit signal in the $DLL_{OUT}$ signal is selected as the INJ signal, i=1, 2, . . . , N. When EN=0010, the second bit signal in the $DLL_{OUT}$ signal is selected as the INJ signal.

Provided is Embodiment 1 of the present disclosure. The frequency of the signal $F_{XO}$ generated by the quartz crystal is 24 MHz, the frequency of the injection signal is approximately 23.88 MHz, the frequency error is approximately 5000 ppm, and $EN_{SW}$ is set to 0.

Figure 5:
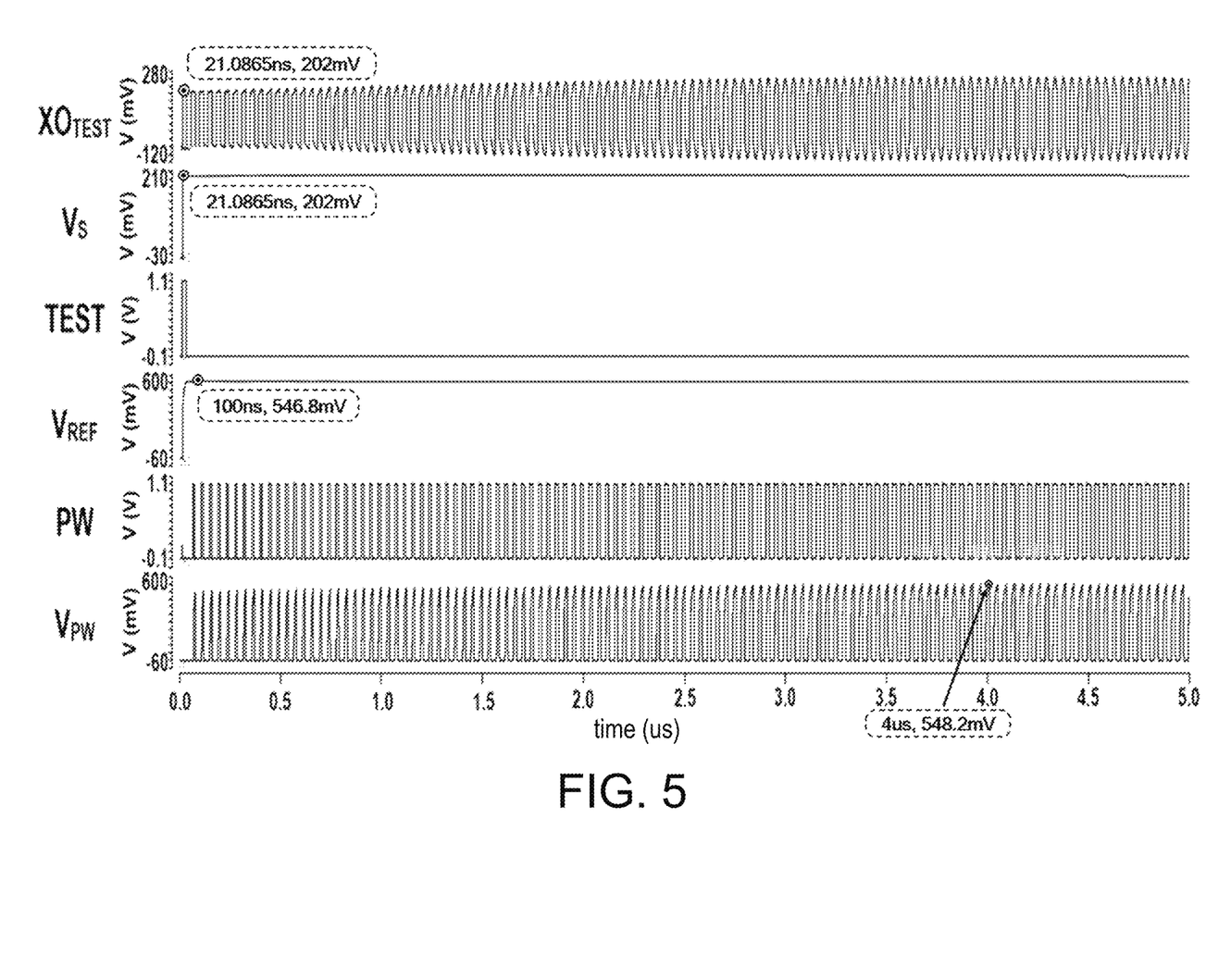
FIG. 5 illustrates a simulation diagram of an input and an output of the sampling and holding module and the phase conversion module when an injection frequency is 23.88 MHz.

As illustrated in FIG. 5, the output signal $XO_{TEST}$ of the buffer is formed by superposing the square wave and the sin wave, as the phase error accumulates, the superposed sin wave is moved relative to the edge of the square wave. The sampling and holding module is configured to sample $XO_{TEST}$, and transmit the sampled voltage $V_S$ to the first comparator $CMP_1$ to compare with the object of the signal $XO_{TEST}$, so that the signal PW with a continuously increasing duty cycle is obtained, which reflects the information of the phase error accumulation.

As illustrated in FIG. 5, the signal TEST output by the digital control module is a reference duty-cycle signal. For a signal of 24 MHz, the reference duty cycle is 50%, which is converted into a corresponding voltage $V_{REF}$ through a phase conversion module, with a value of approximately 546 mV. The initial duty cycle of the PW output by the first comparator $CMP_1$ is 25%, when the duty cycle of the PW output by the first comparator $CMP_1$ is greater than 50%, that is, the $V_{PW}$ exceeds the $V_{REF}$, the phase error accumulation is reached the set threshold, then the phase is required to be switched at this time to maintain the continuous and efficient energy injection. As illustrated in FIG. 5, at 4 μs, the $V_{PW}$ is approximately 548 mV, which is greater than $V_{REF}$, then the phase is switched to implement the 4-phase cyclic injection, and when the reference duty cycle is set to 37.5% by the TEST, then the 8-phase cyclic injection can be implemented.

Figure 6:
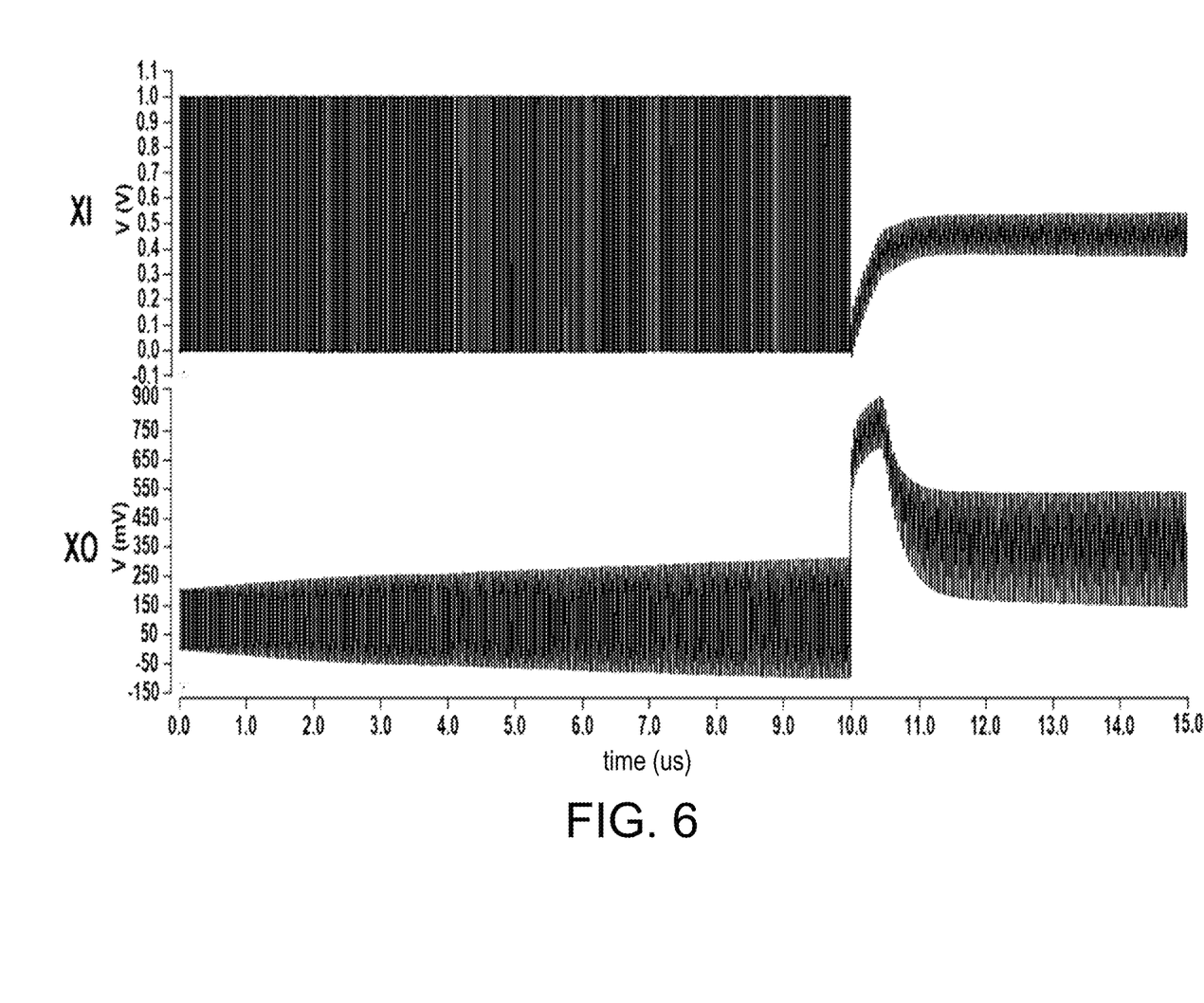
FIG. 6 illustrates a simulation effect diagram of an overall circuit when the injection frequency is 23.88 MHz.

As illustrated in FIG. 6, when the frequency error reaches 5000 ppm, the XI terminal of the quartz crystal is the square wave injection signal. The amplitude at the XO terminal is increased continuously through the 4-phase cyclic injection, that is, the energy can be injected continuously with no negative effect. When the injection is completed, the $EN_{INJ}$ is set to 0, then the stable oscillation mode is switched into.

Provided is Embodiment 2 of the present disclosure. The frequency of the signal $F_{XO}$ generated by the quartz crystal is 24 MHz, the frequency of the injection signal is approximately 24.12 MHz, the frequency error is approximately 5000 ppm, and $EN_{SW}$ is set to 1.

Figure 7:
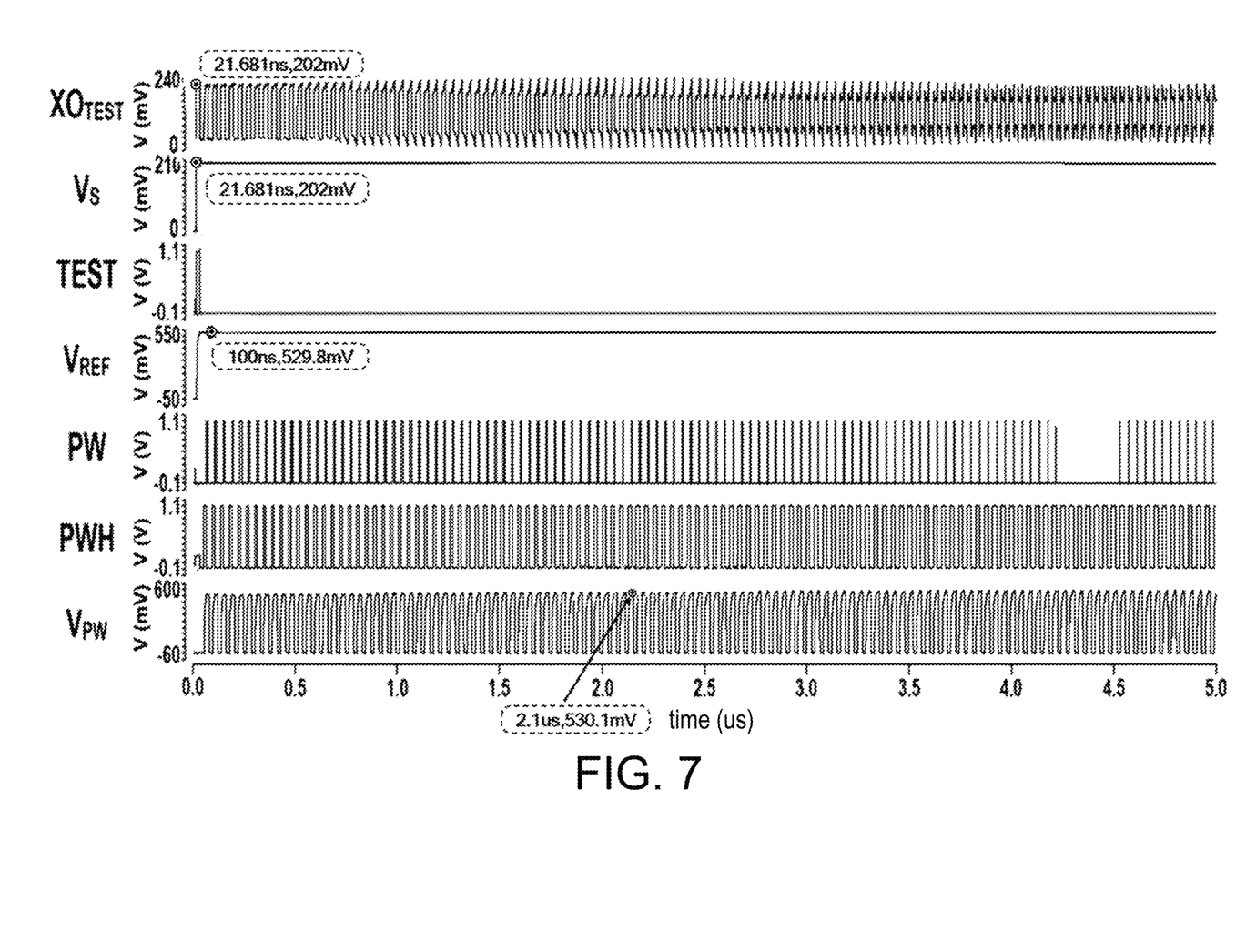
FIG. 7 illustrates a simulation diagram of an input and an output of the sampling and holding module and the phase conversion module when the injection frequency is 24.12 MHz.

As illustrated in FIG. 7, the duty cycles of PW output by the first comparator $CMP_1$ are gradually decreased, and all the duty cycles are 0 at 4.2 µs, whereas the duty cycle of PWH output by the XOR gate is gradually increased. The reference duty cycle is set to 37.5% by the TEST, and the corresponding voltage $V_{REF}$ is approximately 529 mV. At 2.1 µs, the voltage corresponding to PWH is 530 mV, and the phase is switched, which can implement 8-phase cyclic injection.

Figure 8:
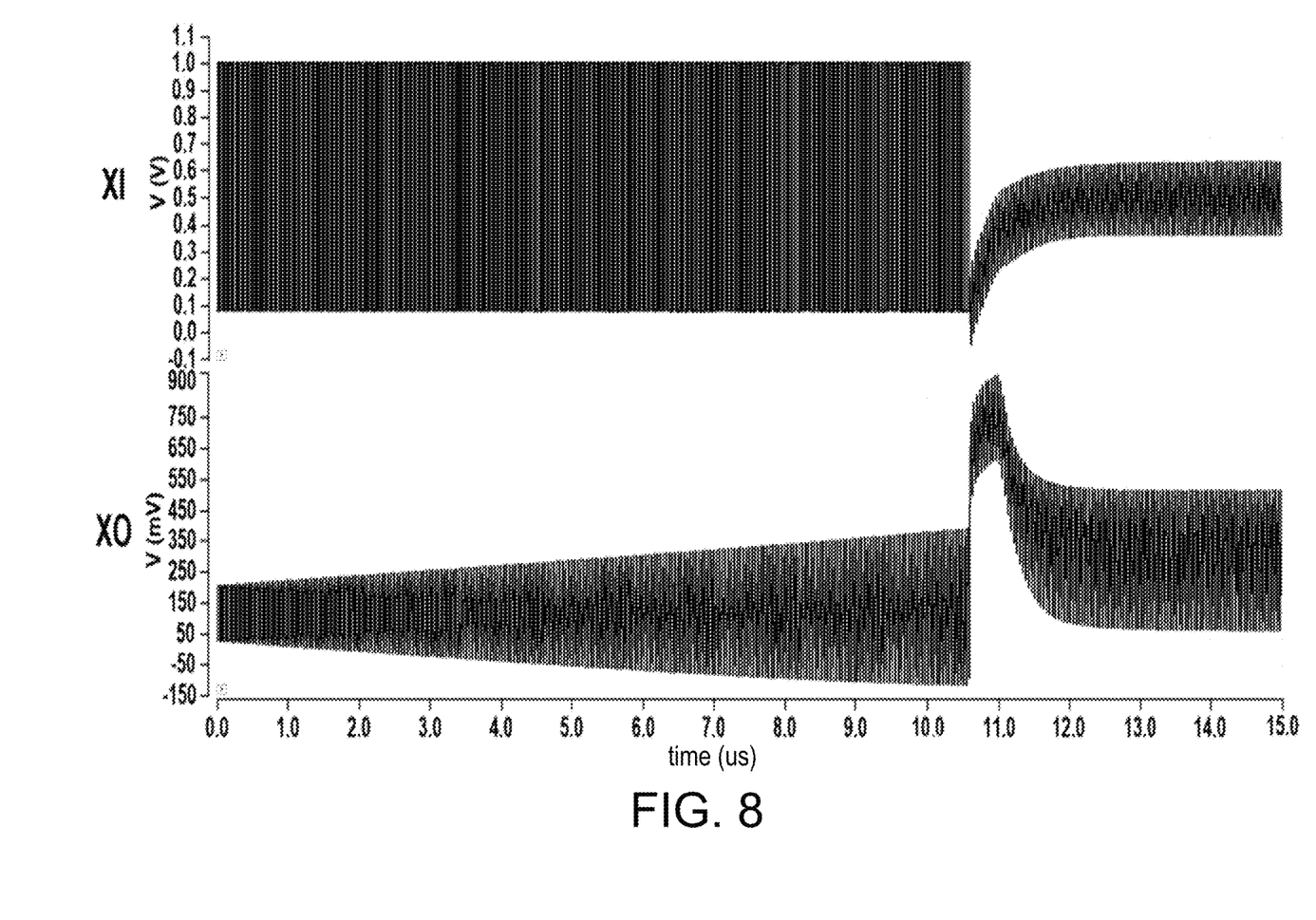
FIG. 8 illustrates a simulation effect diagram of an overall circuit when the injection frequency is 24.12 MHz.

As illustrated in FIG. 8, when the frequency error reaches 5000 ppm, the 8-phase cyclic injection is implement by detecting the duty cycle, and the amplitude at the XO terminal of the quartz crystal can maintain a linear increasing continuously, which accelerates the startup of the crystal oscillator. When the injection is completed, the $EN_{INJ}$ is set to 0, and the stable oscillation mode is switched into.

In the present disclosure, the signal representing the phase error accumulation information, that is, the signal with a constantly varying duty cycle, is obtained by the comparator $CMP_1$ through processing the signal at the XO terminal of the quartz crystal. Then the phase conversion module is configured to convert the duty cycle information into the corresponding voltage signal, and the corresponding voltage signal is compared with the voltage signal converted from the reference duty cycle through the comparator $CMP_2$ to obtain the enabling signal of the phase switching. The 4-phase or 8-phase cyclic injection can be implemented continuously according to the value for N. The phase can be switched accurately and in real time through detecting the duty cycle, which can maintain the continuous increasing of the inductor current without being limited by the phase error accumulation. The present disclosure solves the problems of the discontinuity of the existing double-terminal injection and the blindness of the phase switching, and can tolerate a large frequency error, which reduces the requirements for the design and the calibration of the injection oscillator.

In addition, it should be noted that the various specific technical features described in the above specific embodiments can be combined in any suitable manner without contradiction. In order to avoid the unnecessary repetition, the various possible combinations are not further described in the present disclosure.

What is claimed is:

1. A crystal oscillator based on a duty-cycle detection, wherein the crystal oscillator comprises a first inverter, a resistor, a first load capacitor and a second load capacitor, a first switch, a second switch, a third switch, a fourth switch, a quartz crystal, a buffer, a sampling and holding module, a first comparator, a second comparator, a phase conversion module, a digital control module and an energy injection module; one terminal of the quartz crystal is recorded as XI, and another terminal of the quartz crystal is recorded as XO; the digital control module is configured to generate switch control signals $EN_{INJ}$ and $\overline{EN_{INJ}}$ according to an external control signal, the $EN_{INJ}$ is used for controlling the third and fourth switches to be opened and closed, the $\overline{EN_{INJ}}$ is used for controlling the first and second switches to be opened and closed, the $\overline{EN_{INJ}}$ is an inverted signal of the $EN_{INJ}$, the energy injection module includes a ring-shaped oscillator and a delay locked loop, the ring-shaped oscillator is configured to generate a square wave signal $RO_{OUT}$, the delay locked loop is configured to divide the square wave signal $RO_{OUT}$ into N-path signals with a same frequency and different phases, and the N-path signals are recorded as $DLL_{OUT}$, where N≥4, in an energy injection mode of the crystal oscillator, the third and fourth switches are both closed; the quartz crystal is configured to generate an oscillation signal $F_{XO}$, and the terminal XO of the quartz crystal is configured to transmit a superimposed signal to the buffer through the fourth switch, and the superimposed signal is a signal after superimposing the signal $F_{XO}$ with an injection signal INJ injected into the quartz crystal; the buffer is configured to isolate the sampling and holding module and the terminal XO of the quartz crystal, the buffer is configured to output a signal $XO_{TEST}$ to the sampling and holding module and an non-inverting input terminal of the first comparator, the sampling and holding module is configured to collect a high level of the first cycle of the signal $XO_{TEST}$ to obtain a signal $V_S$, and output the signal $V_S$ to an inverting input terminal of the first comparator; the first comparator is configured to convert phase error accumulation information between the $XO_{TEST}$ and the $V_S$ into a signal PW, and transmit the signal PW to the phase conversion module, the phase conversion module is configured to convert a signal TSET output by the digital control module into an analog voltage $V_{REF}$ and transmit the analog voltage quantity $V_{REF}$ to an inverting input terminal of the second comparator, the phase conversion module is configured to convert the signal PW into an analog voltage quantity $V_{PW}$, and transmit the analog voltage quantity $V_{PW}$ to the non-inverting input terminal of the second comparator, the signal TSET is generated by the digital control module according to the signal $DLL_{OUT}$; the second comparator is configured to compare a magnitude relationship between the $V_{PW}$ and the $V_{REF}$ to generate an enabling signal $EN_{SWITCH}$ and input the enable signal $EN_{SWITCH}$ into the digital control module, the digital control module is configured to generate an signal EN according to the enable signal $EN_{SWITCH}$, and input the signal EN into the energy injection module, the signal EN is N-bit signals; the energy injection module is configured to transmit the signal $DLL_{OUT}$ to the digital control module, and select one bit signal from the signal $DLL_{OUT}$ as the injection signal INJ according to the signal EN and transmit the injection signal INJ to the terminal XI of the quartz crystal through the third switch; and in a stable oscillation mode of the crystal oscillator, the first and second switches are both closed, one terminal of the first switch is in connection with the terminal XI of the quartz crystal, and another terminal of the first switch is in connection with one terminal of the resistor, one terminal of the first load capacitor and an input terminal of the first inverter; one terminal of the second switch is in connection with the terminal XO of the quartz crystal, another terminal of the second switch is in connection with another terminal of the resistor, one terminal of the second load capacitor and an output terminal of the second inverter, and another terminal of the first load capacitor and another terminal of the second load capacitor are both grounded.

2. The crystal oscillator based on the duty-cycle detection according to claim 1, wherein the sampling and holding module includes a fifth switch and a sampling capacitor, one terminal of the fifth switch is in connection with the buffer, and another terminal of the fifth switch is in connection with the inverting input terminal of the first comparator and one terminal of the sampling capacitor, and another terminal of the sampling capacitor is grounded, the fifth switch is controlled by an enable signal $ENS_H$ generated by the digital control module.

3. The crystal oscillator based on the duty-cycle detection according to claim 2, wherein when a first rising edge of the injection signal INJ is detected by the digital control module, the enable signal $EN_{SH}=1$, and the fifth switch is closed; when a first falling edge of the injection signal INJ is detected by the digital control module, the enable signal $EN_{SH}=0$, and the fifth switch is opened.

4. The crystal oscillator based on the duty-cycle detection according to claim 1, wherein the phase conversion module includes an analog voltage quantity $V_{PW}$ conversion circuit and an analog voltage quantity $V_{REF}$ conversion circuit; the analog voltage quantity $V_{PW}$ conversion circuit includes a sixth switch, a seventh switch, a second inverter, a single-pole double-throw switch, a first charging capacitor and an XOR gate; one input terminal of the XOR gate is in connection with the injection signal INJ, another input terminal of the XOR gate is in connection with the signal PW and a second fixed terminal of the single-pole double-throw switch, an output terminal of the XOR gate is in connection with a first fixed terminal of the single-pole double-throw switch, a moving terminal of the single-pole double-throw switch is configured to output an enable signal for controlling the seventh switch to be opened and closed, the moving terminal of the single-pole double-throw switch is further in connection with an input terminal of the second inverter; an output terminal of the second inverter is configured to output an enable signal for controlling the sixth switch to be opened and closed; one terminal of the sixth switch and one terminal of the first charging capacitor are grounded; another terminal of the sixth switch is served as an output terminal for the analog voltage quantity $V_{PW}$ conversion circuit, and is in connection with another terminal of the first charging capacitor and one terminal of the seventh switch; another terminal of the seventh switch is in connection with a voltage VDD; and the analog voltage quantity $V_{REF}$ conversion circuit includes a second charging capacitor and an eighth switch, and the signal TEST is used for controlling the eight switch to be opened and closed, one terminal of the eighth switch is served as an output terminal of the analog voltage quantity $V_{REF}$ conversion circuit and is in connection with one terminal of the second charging capacitor; another terminal of the second charging capacitor is grounded; another terminal of the eighth switch is in connection with the voltage VDD.

5. The crystal oscillator based on the duty-cycle detection according to claim 1, wherein the signal TSET is generated by the digital control module according to the signal $DLL_{OUT}$, specifically the digital control module is configured to extract the injection signal INJ and a next bit signal adjacent to the INJ from the signal $DLL_{OUT}$, when the rising edge of the INJ is detected by the digital control module, then TEST=1, and when the rising edge of the next bit signal adjacent to the INJ is detected by the digital control module, then TEST=0.

6. The crystal oscillator based on the duty-cycle detection according to claim 1, wherein the second comparator is configured to compare the magnitude relationship between the $V_{PW}$ and the $V_{REF}$ to generate the enable signal $EN_{SWITCH}$, specifically, when $V_{PW} \le V_{REF}$, then $EN_{SWITCH}=0$, when $V_{PW} > V_{REF}$, then $EN_{SWITCH}=1$.

7. The crystal oscillator based on the duty-cycle detection according to claim 1, wherein the digital control module is configured to generate the signal EN according to the enable signal $EN_{SWITCH}$, specifically, an initial signal of the EN is set, and an i-th bit signal in the initial signal is 1, where i=1, 2, . . . , N; when the frequency of the injection signal INJ is greater than the frequency of the signal $F_{XO}$ and $EN_{SWITCH}=1$, then a (i−1)-th bit signal in the signal EN is set to 1, and the i-th bit signal is set to 0; when the frequency of the injection signal INJ is equal and less than the frequency of the signal $F_{XO}$ and $EN_{SWITCH}=1$, then the i-th bit signal in the signal EN is set to 0, and the (i+1)-th bit signal is set to 1.

8. The crystal oscillator based on the duty-cycle detection according to claim 1, wherein the energy injection module further includes a multiplexer, the delay locked loop is configured to transmit the generated signal $DLL_{OUT}$ to the multiplexer, and the multiplexer is configured to select one bit signal from the signal $DLL_{OUT}$ as the injection signal INJ according to the inputted signal EN.

9. The crystal oscillator based on the duty-cycle detection according to claim 1, wherein the energy injection module is configured to select one bit signal from the signal $DLL_{OUT}$ as the injection signal INJ according to the signal EN, specifically, when the i-th bit signal in the signal EN is 1, the (N−i+1)-th bit signal in the signal $DLL_{OUT}$ is selected as the injection signal, where i=1, 2, . . . , N.

* * * * *

UNITED STATES PATENT AND TRADEMARK OFFICE
CERTIFICATE OF CORRECTION

| | |
|---|---|
| PATENT NO. | : 12,375,039 B2 |
| APPLICATION NO. | : 18/851063 |
| DATED | : July 29, 2025 |
| INVENTOR(S) | : Zixuan Wang et al. |

It is certified that error appears in the above-identified patent and that said Letters Patent is hereby corrected as shown below:

On the Title Page

Item (71) Applicants should read: Nanjing University Of Posts And Telecommunications, Jiangsu (CN); NANTONG INSTITUTE OF NANJING UNIVERSITY OF POSTS AND TELECOMMUNICATIONS CO., LTD., Jiangsu (CN)

Item (72) Inventors should read: Zixuan Wang, Jiangsu (CN); Xin Wang, Jiangsu (CN); Zhikuang Cai, Jiangsu (CN); Yufeng Guo, Jiangsu (CN); Jiafei Yao, Jiangsu (CN)

Signed and Sealed this
Thirtieth Day of September, 2025

John A. Squires
*Director of the United States Patent and Trademark Office*